United States Patent [19]

Robertson et al.

[11] Patent Number: 4,463,255
[45] Date of Patent: Jul. 31, 1984

[54] APPARATUS FOR ENHANCED NEUTRALIZATION OF POSITIVELY CHARGED ION BEAM

[75] Inventors: David A. Robertson, West Newbury; Norman L. Turner, Gloucester, both of Mass.

[73] Assignee: Varian Associates, Inc., Palo Alto, Calif.

[21] Appl. No.: 450,819

[22] Filed: Dec. 20, 1982

Related U.S. Application Data

[63] Continuation of Ser. No. 190,297, Sep. 24, 1980, abandoned.

[51] Int. Cl.³ .......................................... H01J 37/317
[52] U.S. Cl. ............................. 250/251; 250/492.2; 250/492.3
[58] Field of Search ............... 250/492.2, 492.3, 251, 250/309, 398, 399

[56] References Cited

U.S. PATENT DOCUMENTS

| 3,363,124 | 1/1968 | Bensussan et al. | 313/361.1 |
|---|---|---|---|
| 3,507,709 | 4/1970 | Bower | 148/1.5 |
| 3,622,782 | 11/1971 | Smith et al. | 250/307 |
| 3,676,672 | 7/1972 | Meckel et al. | 250/290 |
| 4,076,558 | 2/1978 | Rupprecht et al. | 148/1.5 |
| 4,118,630 | 10/1978 | McKenna et al. | 250/492.2 |
| 4,135,097 | 1/1979 | Forneris et al. | 250/492.3 |
| 4,249,077 | 2/1981 | Crawford | 250/311 |
| 4,278,890 | 7/1981 | Gruen et al. | 250/492.3 |

FOREIGN PATENT DOCUMENTS

| 54-124879 | 9/1979 | Japan | 250/251 |
|---|---|---|---|
| 1567312 | 5/1980 | United Kingdom . | |

OTHER PUBLICATIONS

A. J. Dekker, *Solid State Physics*, "Secondary Electron Emission," p. 418 et seq., Prentice-Hall, (1957).
D. E. Gray, ed., *American Institute of Physics Handbook*, "Secondry Emission Measurements," pp. 9-183 et seq., 3rd Edition (1972).

Primary Examiner—Alfred E. Smith
Assistant Examiner—Carolyn E. Fields
Attorney, Agent, or Firm—Stanley Z. Cole; William R. McClellan

[57] ABSTRACT

An apparatus for the enhanced neutralization of a positively charged particle beam has a source of primary electrons which are directed at a dummy target positioned adjacent the ion beam. The secondary electrons have a low energy and are susceptible to being entrapped within the volume of the positively charged beam. The ion beam attracts these low energy electrons until effective beam neutralization is achieved. The ions in the beam are individually neutralized when the beam strikes the target.

17 Claims, 5 Drawing Figures

APPARATUS FOR ENHANCED NEUTRALIZATION OF POSITIVELY CHARGED ION BEAM

This application is a continuation of application Ser. No. 190,297, filed Sept. 24, 1980, now abandoned.

DESCRIPTION

This invention relates to apparatus for effecting the neutralization of an ion beam and, more particularly, relates to an apparatus for neutralizing a positively charged ion beam by the stimulated emission of secondary electrons from a dummy target material.

It is well known in the field of ion implantation that a charged ion beam will produce a buildup of charge on the surface of the target being implanted, for example, a semiconductor wafer. This charge may be removed from the surface of the wafer by placing it on a conductive platen and allowing a current to be drawn away through the platen. However, with insulating and semiconductive material, such as are encountered in integrated circuit processing, it is not possible to rely upon this mechanism to fully and effectively produce neutralization of the surface of the target. In these instances, charge builds up on the surface of the material; this charge is typically positive since most ion beams are positively charged. Such charge may impede automatic wafer handling due to sticking, may punch through portions of integrated circuits being formed and may produce non-uniform implantation due to charged portions of the wafer deflecting the ion beam. The presence of such surface charge therefore is believed to reduce yields in the production of integrated circuits. See e.g., M. Nakano, et al., "Surface Potential of $SiO_2$ During Ion Implantation", Proceedings, Charge Storage, Charge Transport and Electrostatics With Their Applications, pp. 210-11 (Oct. 9-12, 1978, Kyoto, Japan).

In practicable ion implantation systems, the ion beams are typically positively charged boron, arsenic, phosphorous or the like. Therefore, the attempt to reduce charging on the surface of wafers has been an attempt to provide electrons to produce the neutralization of the species within the ion beam. This approach is generally known by the designation of electron flooding. In its basic form, it entails the application of electrons to the surface of the target. For semiconductor wafers undergoing implantation, however, it has been found that the direct application of electrons can produce contamination from the filament of the electron source. See, e.g., J. L. Forneris, et al., "Ion Implantation Apparatus for Controlling the Surface Potential of a Target Surface", U.S. Pat. No. 4,135,097 and C. M. McKenna et al., "Ion Implantation Apparatus With a Cool Structure Controlling the Surface Potential of a Target Surface", U.S. Pat. No. 4,118,630. The approach set out in these patents is to provide a shield between the electron source and the target to inhibit direct radiation of the target by the surface. Instead, the electrons are introduced into the beam generally transverse to the beams to attempt to produce a neutralization of the beam. The individual ions in the beam are not neutralized but rather, an effective neutralization of charge within the volume of the beam is obtained. In effect, the ions travel as ions and the electrons travel as electrons but are trapped within the positive field of the ion beam. When the ions and the electrons within the beam reach the surface of the target, they are no longer free to move in the direction of the beam and can only move in the plane of the surface; they move about in this plane until neutralization occurs. With this approach the efficiency of entrapment of electrons within the beam may be low due to the high velocity of the thermal electrons and to the low capture cross-section of the electrons by the beam.

Given that it is undesirable to impact a semiconductor wafer directly with electrons, it remains necessary to produce neutralization of an ion beam by some means in order to avoid charging at the surface of the wafer being implanted. As stated above, neutralization does not normally entail the neutralization of each individual ion but rather the space charge neutralization of the volume of the ion beam. Yet even here the capture cross-sections of the volume of the ion beam for electrons is relatively small. This cross-section may be increased by increasing the beam current and therefore increasing the attraction of the beam for electrons but this leads to greater charging on the substrate. On the other hand, slowing down the electrons would increase the probability of entrapment. Electrons emitted from thermal sources can be provided with any desired velocity but often it is difficult to produce enough electrons from such thermal sources at low enough energies to produce effective neutralization.

It is therefore an object of the present invention to provide an apparatus for producing enhanced neutralization of a positively charged beam.

It is a further object of the present invention to provide an apparatus which deliberately produces secondary electrons from a dummy target in order to provide sufficient electrons of an energy which renders them susceptible to entrapment within a moving positively charged ion beam.

It is an additional object of the present invention to amplify the quantity of electrons available for neutralization of a positively charged particle beams by impacting an electron beam against a dummy target to produce a yield of secondary electrons greater than one.

BRIEF DESCRIPTION OF THE DRAWINGS

For a complete understanding of the apparatus of the present invention, reference may be had to the accompanying drawings which are incorporated herein by reference and in which.

SUMMARY OF THE INVENTION

An apparatus for the enhanced neutralization of a positively charged particle beam has a source of primary electrons which are directed at a dummy target positioned adjacent the ion beam. The secondary electrons have a low energy and are susceptible to being entrapped within the volume of the positively charged beam. The ion beam attracts these low energy electrons until effective beam neutralization is achieved. The ions in the beam are individually neutralized when the beam strikes the target.

DESCRIPTION OF THE PREFERRED EMBODIMENTS

There is a need in ion implantation equipment to control the space charge of the ion beam. Generally, the positive space charge will produce a spreading of the beam beyond desirable limits. Thus, it is known to produce some neutralization of the beam at the source by supplying excess source gas so that ions, once generated and at least partially accelerated, may interact with this gas and become neutralized. This approach, however, is not susceptible to good control and can overneutralize the beam. Also, it is not entirely acceptable if several stages of acceleration are used which necessarily requires that the beam remain ionized downstream. Also, a beam that has been partially neutralized may experience a loss of electrons in the travelling beam due to passage through electrostatic lenses or past bias plates. Thus, in view of beam dispersion as well as wafer charging there exists a general requirement of neutralizing a positively charged ion beam by apparatus capable of fine control and of generating sufficient trappable electron current.

Figure 1:
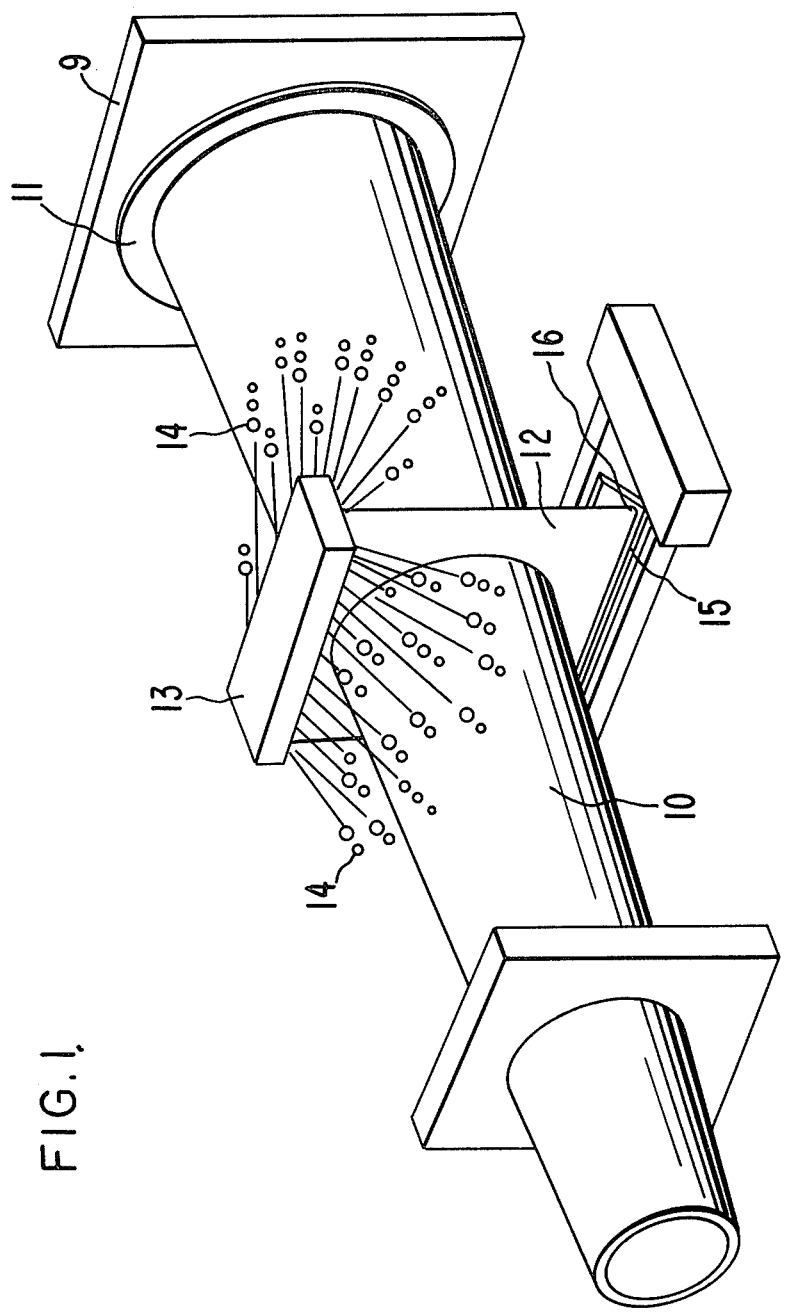
FIG. 1 is a pictorial view of an ion beam striking a target in conjunction with the secondary electron producing apparatus of the present invention.

As shown in FIG. 1, an ion beam 10 in a practicable ion implanter will be slightly diverging and generally conical. The divergence as described previously is due to the internal repulsion of the positively charged ions. In the prior art, electrons have been used to flood the target 11, e.g., a semiconductor wafer, or as in J. L. Fourneiris, et al., U.S. Pat. No. 4,135,097 electrons have been introduced directly into the beam and entrapped by the beam upstream of the target. Or the ion beam has been neutralized at the source by arranging for collisions with excess gas molecules. In any of these cases, beam dispersion may be partially controlled or surface charging may be reduced.

Figure 2:
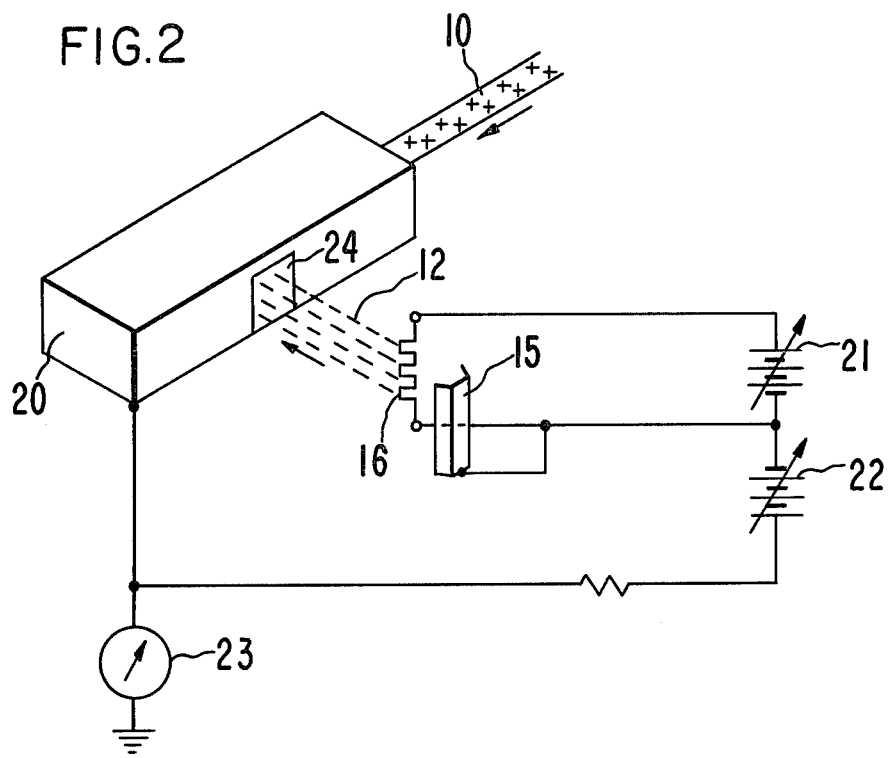
FIG. 2 is a diagram of the features of the secondary electron producing apparatus of the present invention.
Figure 4:
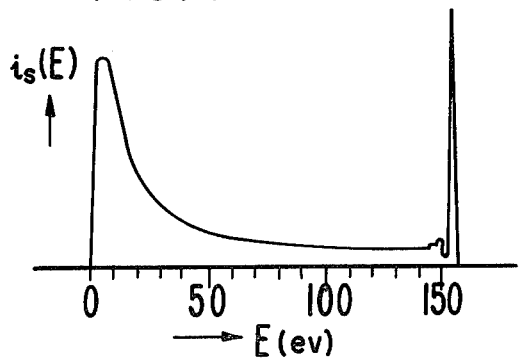
FIG. 4 is a plot of secondary electron energies for a silver target.

The apparatus of the present invention, shown in FIGS. 1-2, produces enhanced beam neutralization by generating a primary electron beam 12 which strikes a dummy target 13 and produces a scattered distribution of secondary electrons 14 which become entrapped in the ion beam. The term secondary electron is used here to signify those electrons that are stimulated to be emitted from the surface of the dummy target. This is electron emission stimulated by received electrons as compared with secondary electrons of the type produced by the implantation of ions into a target. The yield of these secondary electrons is defined as the ratio of emitted secondary electrons 14 to the electrons incident from the primary beam 12. The yield from the dummy target can be selected by choosing the material of the dummy target and by controlling the energy of the primary electrons. See. A. J. Dekker, *Solid State Physics,* "Secondary Electron Emission", pp. 418 et seq. (1957); D. E. Gray, ed., *American Institute of physics handbook,* "Secondary Emission" pp. 9-183, et seq., 3rd Edition (1972). The emitted secondary electrons are slow moving as compared to the primary electron beam and most have energies less than 100 ev and therefore have a significant capture cross-section in the field of the moving ion beam. This is shown in FIG. 4 for secondary electrons produced by bombarding a silver surface with primary electrons of 155 ev (taken from A. J. Dekker, above, p. 419). The peaks near 150 ev represent reflected primary secondary electrons. The great bulk of the secondary electrons have an energy of a few ev and are trappable. The yield of secondary electrons can be greater than once since it consists of both reflected primary electrons and true secondary electrons. In a preferred embodiment, the secondary electron yield from the dummy target 13 is at least one. As shown in FIG. 1, the secondary electrons 14 are scattered as well as slow moving and are presented to the ion beam along a greater section of its length to thereby facilitate entrapment.

For a given material there is a relationship between secondary electron yield and the energy of the incident electron beam. There is an incident energy for maximum yield for metals which varies from about 300 ev (Al) to about 800 ev (Pt) and for oxides is as high as 1100 ev (MgO). (A. J. Dekker, above, p. 422). There is no need to exceed this energy in the incident beam unless it is necessary to overcome impeding forces in the vicinity of the electron source. It has been found that the use of incident electrons of energy lower than the optimum may slightly reduce the enhancement of neutralization. However, a more significant factor is believed to be the self-limiting space charge phenomenon of the beam itself: the greater the net positive charge on the ion beam, the more strongly the neutralizing electrons are attracted. The ion beam effectively takes the electrons it needs providing they are available. The apparatus of the present invention provides these electrons in sufficient quantity at the right energies to be trapped. This same provision may not readily be made by a primary electron beam because insufficient current is available at low enough energies from thermal sources.

Figure 3:
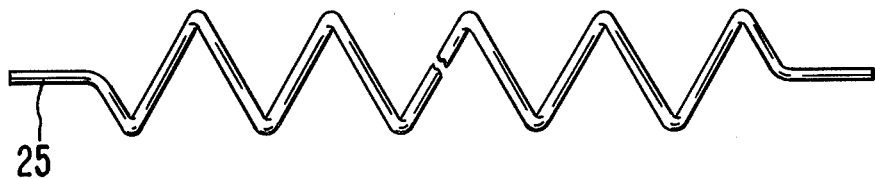
FIG. 3 is a perspective of a preferred filament configuration for the electron gun of the secondary electron producing apparatus of the present invention.

The primary electron beam 12 is generated by a filament electrode 16. Current is supplied to filament electrode 16 by filament current supply 21 which regulates the amount and the average kinetic energy of electrons emitted from the filament electrode 16. Reflector shield 15 is used to electrostatically direct the electrons emitted by thermionic emission from filament electrode 16 towards dummy target 13. To prevent the reflector from impeding the emission of primary electrons a bias voltage supply 22 keeps the reflector at a voltage at least as negative as the potential of the emitted electrons with respect to the Faraday cage 20 not to interfere with the emission of the beam. In a preferred embodiment, the reflector is electrically tied to the filament. Also, in a preferred embodiment, as shown in FIG. 3, the filament describes a helix 25 to enhance electron emission. In another preferred embodiment, as shown in FIG. 1, the primary electron beam 12 passes through the positive ion beam before striking the dummy target 13. As well known in the field of ion implantation, the positively charged ion beam 10 enters a Faraday cage 20 which contains the platen 9 and wafer 11 to be implanted. As shown in FIG. 2 for the present invention, the primary electron beam enters this region through an opening 24; the total current measured by ammeter 23 thus reflect this contribution as well as the contribution of ion beam 10 and secondary electrons both from electrons out of the dummy target and from ions on the semiconductor wafer. In another embodiment, the apparatus of the present invention is applied further upstream without a Faraday cage to neutralize the beam to prevent dispersion.

Figure 5:
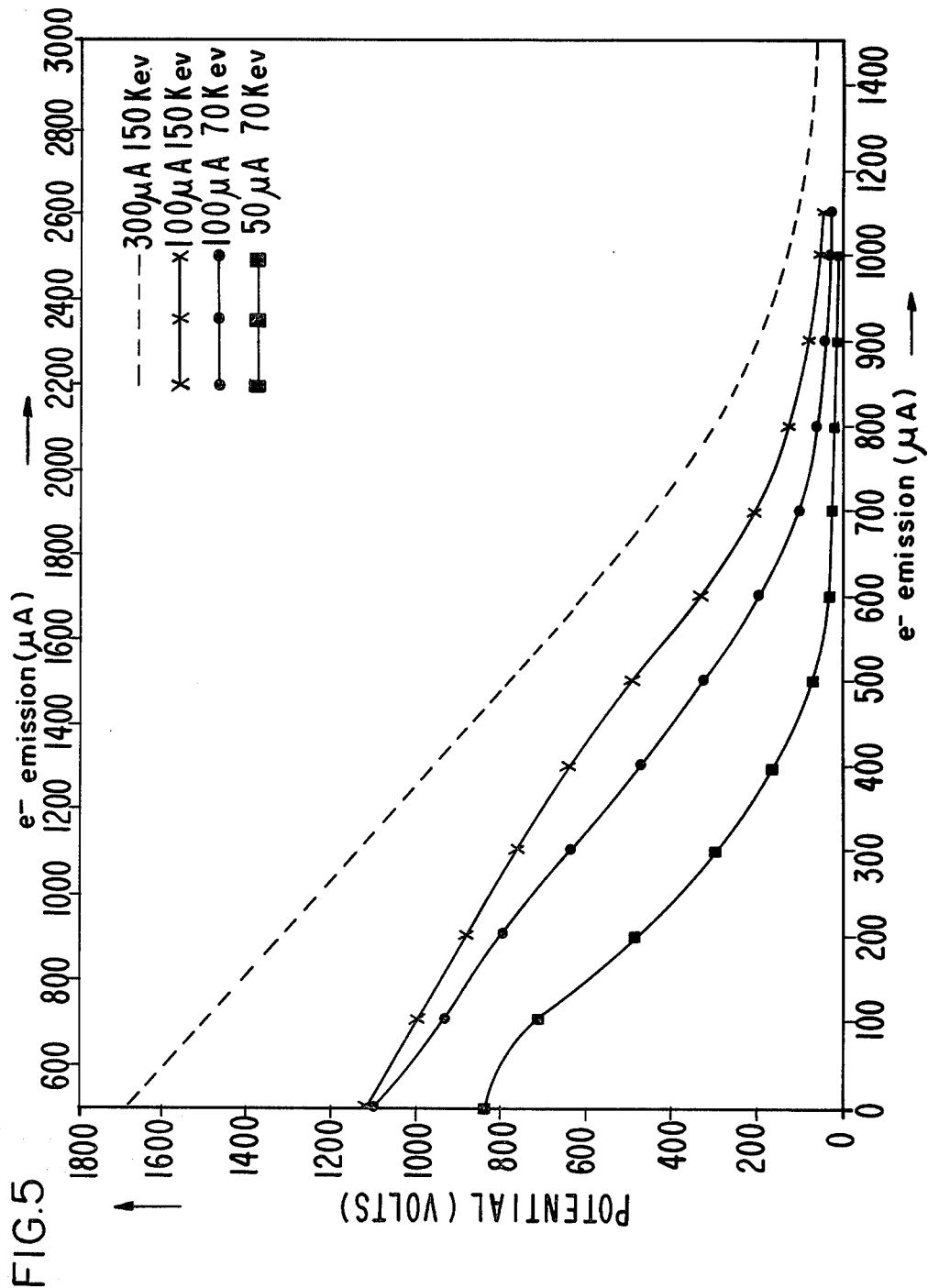
FIG. 5 is a chart showing the decrease in potential on a surface as a function of positive ion beam current and the primary electron beam which produces secondary electrons.

The effectiveness of the apparatus of the present invention is shown by the curves of FIG. 5. The apparatus of FIGS. 1 and 2 was used with the shield being composed of aluminum. A metal surface having a 10 megohm resistance between it and ground was exposed to a positive ion beam having the currents shown in the legend of the upper-right hand corner. The three solid curves represent the potential on the metal surface as a function of the current (in microamperes) of the primary electron beam. The potential of the metal surface is reduced nearly to zero when sufficient primary electron current is provided, as shown on the lower abscissa, to stimulate the emission from the dummy target of an adequate number of secondary electrons to neutralize the beam. The ion beam with the highest current (300 $\mu$A, 150 Kev) was also neutralized with a yet higher primary electron current as shown by the scale on the upper abscissa. The shape of the curves indicates that the production of secondary electrons increases directly as the primary beam current but that incorporation in the beam proceeds more slowly as the beam approaches neutrality. This is consistent with the self-limiting phenomenon discussed above.

We claim:

1. An apparatus for enhanced neutralization of a beam of positive ions in an ion implantation system, comprising:
    an electron source for generating a primary electron beam; and
    means responsive to said primary electron beam for providing controllable secondary electron emission independently of said beam of positive ions, said secondary electron emission means comprising a dummy target for emitting secondary electrons having lower energies than said primary electron beam when stimulated by bombardment by said primary electron beam, said dummy target being positioned adjacent to but not in the path of said beam of positive ions within said system to permit said secondary electrons to be entrapped within said positive ion beam.

2. The apparatus of claim 1 wherein said primary electron beam generated by said electron source passes through said positive ion beam before striking said dummy target.

3. The apparatus of claim 1 wherein the kinetic energy of the electrons in said primary electron beam is selected to be at least as great as the energy required to produce the maximum yield of secondary electrons from said dummy target.

4. The apparatus of claim 1 wherein the secondary electron yield from said dummy target is at least one.

5. The apparatus of claim 4 wherein said dummy target is composed of a metal.

6. The apparatus of claim 5 wherein said metal of said dummy target is aluminum.

7. The apparatus of claim 1 wherein said electron source comprises a:
    a filament;
    an electrical power source for heating said filament; and
    a reflector shield disposed to reflect electrons in the direction of said dummy target.

8. The apparatus of claim 7 wherein said electrical power source regulates the amount and the average kinetic energy of electrons emitted from said electron source.

9. The apparatus of claim 8 wherein said filament describes a helix.

10. The apparatus of claim 1 wherein most of said secondary electrons have energies less than 100 eV.

11. A method of enhanced neutralization of a beam of positive ions in an ion implantation system, comprising the steps of:
    generating a primary electron beam;
    providing controllable secondary electron emission independently of said beam of positive ions by directing said primary electron beam at a dummy target positioned adjacent to said beam of positive ions, thereby causing secondary electrons having lower energies than said primary electron beam to be emitted from said dummy target and entrapped within said beam of positive ions.

12. A method of claim 11 wherein said step of providing controllable secondary electron emission includes directing said primary electron beam through said beam of positive ions to said dummy target.

13. A method as defined in claim 11 further including the steps of controlling the current in said beam of positive ions and varying said secondary electron emission in accordance with said ion beam current to provide neutralization of said beam of positive ions.

14. In apparatus for neutralization of a beam of positive ions in an ion implantation system, said apparatus including an electron source for generating a primary electron beam, the improvement comprising:
    means responsive to said primary electron beam for providing controllable secondary electron emission independently of said beam of positive ions, said secondary electron emission means comprising a dummy target for emitting secondary electrons when stimulated by bombardment by said primary electron beam, said secondary electrons having lower energies than said primary electron beam, said dummy target being positioned adjacent to but not in the path of said beam of positive ions to permit said secondary electrons to be entrapped within said positive ion beam.

15. The improvement as defined in claim 14 wherein most of said secondary electrons have energies less than 100 eV.

16. Ion implanatation apparatus comprising:
    means for generating a beam of positive ions;
    an electron source for generating a primary electron beam; and
    means responsive to said primary electron beam for providing controllable secondary electron emission independently of said beam of positive ions, said secondary electron emission means comprising a dummy target for emitting secondary electrons having lower energies than said primary electron beam when stimulated by bombardment by said primary electron beam, said dummy target being positioned adjacent to but not in the path of said beam of positive ions to permit said secondary electrons to be entrapped within said positive ion beam.

17. The apparatus as defined in claim 16 wherein said primary electron beam passes through said positive ion beam before striking said dummy target.

* * * * *